United States Patent
Lee (10) Patent No.: US 9,570,519 B2
(45) Date of Patent: Feb. 14, 2017

(54) ORGANIC LIGHT EMITTING DISPLAY DEVICE WITH MULTI-ORGANIC LAYERS

(71) Applicant: LG DISPLAY CO., LTD., Seoul (KR)

(72) Inventor: Se Hee Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/527,528

(22) Filed: Oct. 29, 2014

(65) Prior Publication Data

US 2016/0126485 A1 May 5, 2016

(51) Int. Cl.
*H01L 27/32* (2006.01)
*H01L 51/52* (2006.01)

(52) U.S. Cl.
CPC ....... *H01L 27/3211* (2013.01); *H01L 51/5278* (2013.01); *H01L 51/5218* (2013.01); *H01L 51/5234* (2013.01); *H01L 2251/558* (2013.01)

(58) Field of Classification Search
CPC .. H01L 51/56; H01L 27/3211; H01L 51/5056; H01L 51/5072; H01L 51/5088
USPC ........................................ 313/501–511, 512
See application file for complete search history.

(56) References Cited

U.S. PATENT DOCUMENTS

| | | | |
|---|---|---|---|
| 7,271,537 B2 * | 9/2007 | Matsuda | H01L 51/5265 313/504 |
| 2005/0242712 A1 | 11/2005 | Sung | |
| 2009/0242911 A1 * | 10/2009 | Ishihara | H01L 27/3211 257/89 |
| 2011/0073885 A1 | 3/2011 | Kim et al. | |
| 2011/0168988 A1 * | 7/2011 | Jeong | H01L 51/5265 257/40 |
| 2012/0274201 A1 * | 11/2012 | Seo | H01L 51/0085 313/504 |
| 2013/0320308 A1 | 12/2013 | Lee et al. | |
| 2013/0320837 A1 * | 12/2013 | Weaver | H05B 33/14 313/504 |
| 2014/0151658 A1 * | 6/2014 | Lee | H01L 51/5012 257/40 |
| 2014/0167015 A1 * | 6/2014 | Lee | H01L 51/5012 257/40 |
| 2014/0183482 A1 * | 7/2014 | Lee | H01L 51/5064 257/40 |

(Continued)

FOREIGN PATENT DOCUMENTS

JP 2007-59124 A 3/2007

*Primary Examiner* — Tracie Y Green
(74) *Attorney, Agent, or Firm* — Birch, Stewart, Kolasch & Birch, LLP (57) ABSTRACT

Discussed is an organic light emitting display device. The organic light emitting display device includes a substrate in which red, green, and blue pixel areas are defined, a first electrode and a hole transport layer formed on the substrate, first to third emitting material layers formed in each of the red, green, and blue pixel areas on the hole transport layer, a first electron transport layer formed on the first to third emitting material layers, a first charge generation layer formed on the first electron transport layer, a second charge generation layer formed on the first charge generation layer, fourth to sixth emitting material layers formed in each of the red, green, and blue pixel areas on the second charge generation layer, a second electron transport layer formed on the fourth to sixth emitting material layers, and a second electrode formed on the second electron transport layer.

20 Claims, 8 Drawing Sheets

(56) References Cited

U.S. PATENT DOCUMENTS

| | | | |
|---|---|---|---|
| 2014/0183496 A1* | 7/2014 | Heo | H01L 27/3209 257/40 |
| 2015/0144926 A1* | 5/2015 | Lee | H01L 51/5265 257/40 |
| 2015/0155519 A1* | 6/2015 | Lee | H01L 51/5265 257/40 |
| 2015/0188067 A1* | 7/2015 | Lee | H01L 51/5012 257/40 |
| 2015/0188087 A1* | 7/2015 | Lee | H01L 51/5265 257/40 |
| 2015/0194471 A1* | 7/2015 | Lee | H01L 51/5218 257/40 |

* cited by examiner

ORGANIC LIGHT EMITTING DISPLAY DEVICE WITH MULTI-ORGANIC LAYERS

BACKGROUND

Field of the Invention

The present invention relates to an organic light emitting display device and a method of manufacturing the same.

Discussion of the Related Art

As a type of new flat panel display device, organic light emitting display devices are self-emitting display devices, and have a better viewing angle and contrast ratio than liquid crystal display (LCD) devices. Also, since the organic light emitting display devices do not need a separate backlight, it is possible to lighten and thin the organic light emitting display devices, and the organic light emitting display devices have excellent power consumption compared to LCD devices and the other flat panel display devices. Furthermore, the organic light emitting display devices are driven with a low direct current (DC) voltage, have a fast response time, and are low in manufacturing cost.

In organic light emitting display devices, an electron and a hole are respectively injected from a cathode and an anode into an emitting material layer, and, when an exciton in which the injected electron and hole are combined is shifted from an excited state to a base state, light is emitted. In this case, the types of organic light emitting display devices are categorized into a top emission type, a bottom emission type, and a dual emission type according to an emission direction of light, and categorized into a passive matrix type and an active matrix type according to a driving type.

Therefore, in an organic light emitting display device, when a scan signal, data signals, and power are supplied to a plurality of sub-pixels which are arranged in a matrix type, a selected sub-pixel emits light to display an image. In this case, each of the plurality of sub-pixels includes: a thin film transistor (TFT) which includes a switching TFT, a driving TFT, and a capacitor; and an organic light emitting element which includes a first electrode connected to the driving TFT included in the TFT, an organic layer, and a second electrode.

Recently, a display device of a high-resolution product group is desired. In order to implement the high-resolution display device, it is required to increase the number of pixels per unit area, and high luminance is needed. However, due to a limitation in the structure of the organic light emitting display device, efficiency characteristic is limited, and a current increases. For this reason, an electrical and thermal stress to the device increases, causing a reduction in the reliability of the device.

Therefore, in order to implement a high-resolution product, research is being done for a method of overcoming a structural limitation in the organic light emitting display device and a method of addressing problems such as an increase in power consumption, a reduction in a service life, and a degradation in reliability.

SUMMARY

Accordingly, the present invention is directed to provide an organic light emitting display device and a method of manufacturing the same that substantially obviate one or more problems due to limitations and disadvantages of the related art.

An aspect of the present invention is directed to provide an organic light emitting display device, which has high-luminance characteristic, a long service life, good efficiency characteristic, and an improved reliability of a device for implementing a high-resolution product, and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a substrate in which a red pixel area, a green pixel area, and a blue pixel area are defined; a first electrode and a hole transport layer formed on the substrate; first to third emitting material layers formed in each of the red pixel area, the green pixel area, and the blue pixel area on the hole transport layer to have different thicknesses; a first electron transport layer formed on the first to third emitting material layers; a first charge generation layer formed on the first electron transport layer; a second charge generation layer formed on the first charge generation layer; fourth to sixth emitting material layers formed in each of the red pixel area, the green pixel area, and the blue pixel area on the second charge generation layer to have different thicknesses; a second electron transport layer formed on the fourth to sixth emitting material layers; and a second electrode formed on the second electron transport layer.

In another aspect of the present invention, there is provided a method of an organic light emitting display device including: forming a first electrode all over a substrate in which a red pixel area, a green pixel area, and a blue pixel area are defined; forming a hole transport layer on the first electrode; forming first to third emitting material layers at respective positions corresponding to the red pixel area, the green pixel area, and the blue pixel area on the hole transport layer, wherein the first to third emitting material layers have different thicknesses; forming a first electron transport layer all over the first to third emitting material layers; forming a first charge generation layer and a second charge generation layer all over the first electron transport layer; forming fourth to sixth emitting material layers at respective positions corresponding to the red pixel area, the green pixel area, and the blue pixel area on the second charge generation layer, wherein the fourth to sixth emitting material layers have different thicknesses; forming a second electron transport layer all over the fourth to sixth emitting material layers; and forming a second electrode all over the second electron transport layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings. Like reference numerals refer to like elements throughout. In the following description, when the detailed description of the relevant known function or configuration is determined to unnecessarily obscure the important point of the present invention, the detailed description will be omitted.

Figure 1:
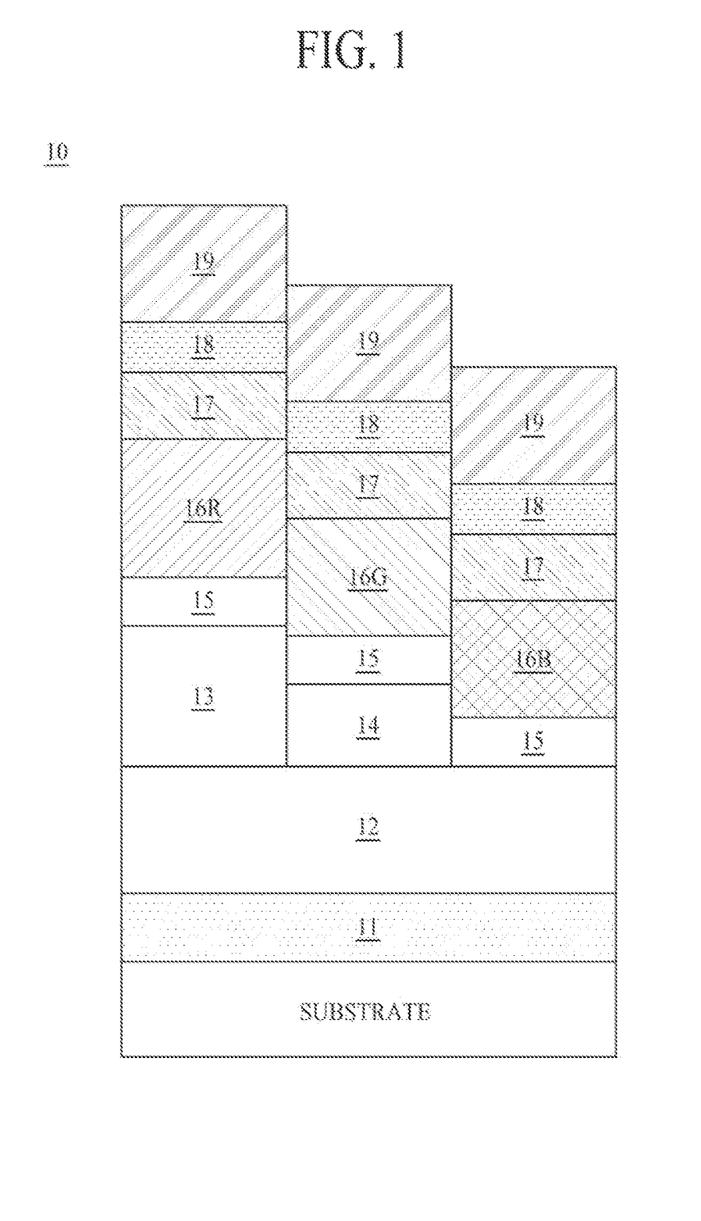
FIG. 1 is a cross-sectional view schematically illustrating a general organic light emitting display device.

FIG. 1 is a cross-sectional view schematically illustrating a general organic light emitting display device.

As illustrated in FIG. 1, an organic light emitting display device 10 includes a first electrode 11, a second electrode 18, a capping layer 19, and an organic layer formed between the first and second electrodes 11 and 18, which are formed on a substrate. Here, the organic layer include first to third hole transport layers 12 to 14, an electron injection layer 15, a plurality of emitting material layers 16R, 16G and 16B, and an electron transport layer 17.

The organic light emitting display device 10 includes the substrate in which a display area including a plurality of pixel areas is defined, a driving TFT which is formed in each of the plurality of pixel areas, and a protective layer which is formed on the driving TFT. Also, the first electrode 11 connected to a drain electrode exposed by a contact hole which is formed in the protective layer is formed, and the organic layer including the emitting material layers 16R, 16G and 16B having a single-layer structure is formed on the first electrode 11. The second electrode 18 is formed on the organic layer.

As described above, in the organic light emitting display device 10, the emitting material layers are generally formed in a single-layer structure.

Figure 2:
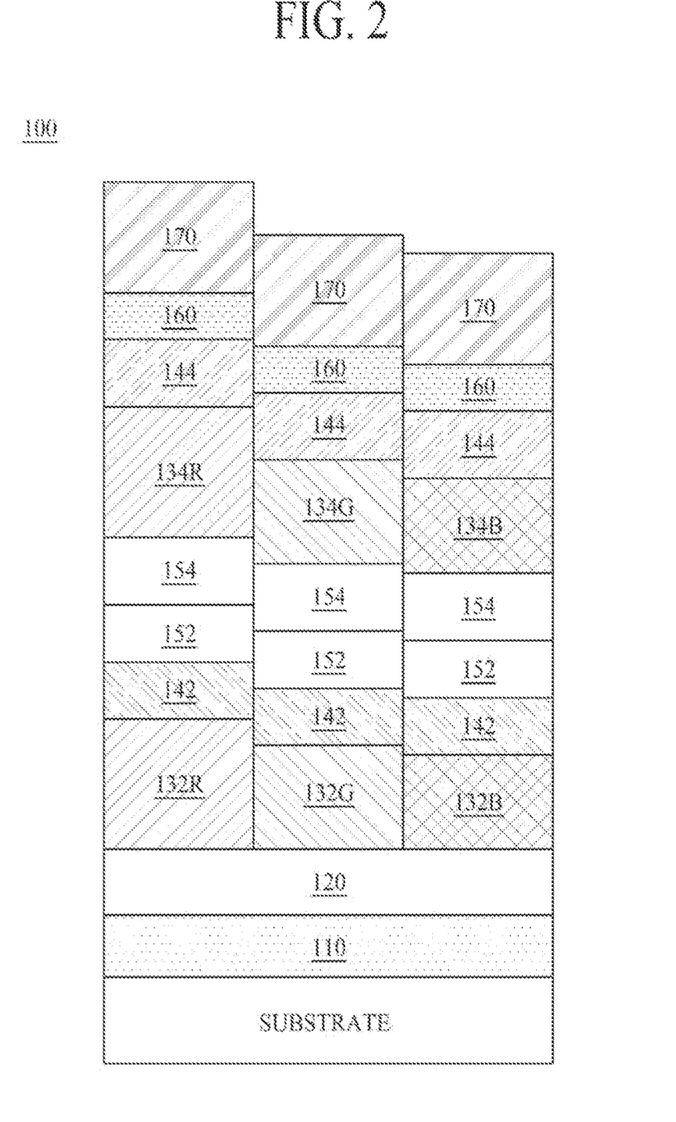
FIG. 2 is a cross-sectional view schematically illustrating an organic light emitting display device according to an embodiment of the present invention.

FIG. 2 is a cross-sectional view schematically illustrating an organic light emitting display device according to an embodiment of the present invention.

As illustrated in FIG. 2, an organic light emitting display device 100 includes a first electrode (an anode) 110, a hole transport layer 120, first to third emitting material layers 132R, 132G and 132B, a first electron transport layer 142, a first charge generation layer 152, a second charge generation layer 154, fourth to sixth emitting material layers 134R, 134G and 134B, a second electron transport layer 144, a second electrode (a cathode) 160, and a capping layer 170 which are sequentially formed on a substrate in which a red pixel area Rb, a green pixel area Gp, and a blue pixel area Bp are defined. All the components of the device 100 are operatively coupled and configured.

In an embodiment, the organic light emitting display device 100 includes a gate line and a data line which intersect each other to define each of the pixel areas Rp, Gp and Bp on the substrate, a power line which extend in parallel with one selected from the gate line and the data line, a switching TFT which is connected to the gate line and the data line in each of the pixel areas Rp, Gp and Bp, and a driving TFT which is connected to the switching TFT. Here, the driving TFT is connected to the first electrode 110. Also, the organic light emitting display device 100 includes an organic layer which is formed between the first electrode 110 and the second electrode 160 facing the first electrode 110. In this case, the organic layer includes the hole transport layer 120, the first to third emitting material layers 132R, 132G and 132B, the first electron transport layer 142, the first charge generation layer 152, the second charge generation layer 154, the fourth to sixth emitting material layers 134R, 134G and 134B, and the second electron transport layer 144.

As described above, in the organic light emitting display device 100 according to an embodiment of the present invention, an emitting material layer is formed of multi layers. That is, a plurality of emitting material layers are formed in each of the pixel areas Rp, Gp and Bp, and thus, efficiency and life characteristics can be enhanced, thereby improving reliability. Accordingly, a structural limitation in the general organic light emitting display devices is overcome, and a high resolution can be realized by the present invention.

In this case, in the organic light emitting display device 100, light efficiency is determined based on a micro-cavity effect, a reflectivity of the first electrode, and a transmittance of the second electrode. Here, an optical distance in each of the pixel areas Rp, Gp and Bp should be considered, and even when the plurality of emitting material layers are formed as in the present invention, a total thickness of the organic layer should be the same as a total thickness of an organic layer including an emitting material layer which is formed in a single-layer structure.

Hereinafter, the elements of the organic light emitting display device 100 according to an embodiment of the present invention will be described in more detail. However, the following embodiment merely exemplifies the present invention, and the present invention is not limited to the following embodiment.

First, the substrate includes a plurality of pixel areas which are divided by the gate line (not shown) and the data line (not shown), and a driving TFT is formed in each of the plurality of pixel areas.

Here, the substrate may be formed of a transparent glass material, or may be formed of plastic or a polymer film which has good flexibility for implementing a flexible display.

Although not shown, a buffer layer (not shown) of $SiO_2$ or SiNx may be further formed on the substrate so as to protect a driving element, which is formed in a subsequent process, from impurities such as alkali ions leaked to the outside.

A TFT includes a driving TFT and a switching TFT. In addition to such elements, a compensation circuit (i.e., a plurality of capacitors) for compensating for a threshold voltage of the driving TFT may be further formed, and may be freely disposed. In this case, the driving TFT (not shown)

is connected to and controlled by the switching TFT, and a voltage applied to the first electrode 110 may be adjusted according to the turn-on/off of the driving TFT.

The first electrode 110 is an anode electrode. The first electrode 110 is separately formed in each sub-pixel and on the protective layer (not shown), and is connected to the drain electrode. In this case, the first electrode 110 should act as one of a plurality of the electrodes included in the organic light emitting display device 100, and thus may be formed of a conductive material. The first electrode 110 may be a multi-layer reflective electrode which is formed of ITO, IGZO, IZO, IZTO, ZnO, ZTO, FTO, FZO AZO, ATO, GZO, or $In_2O_3$ on a reflective layer after the reflective layer is formed of Ag, Mg, Al, Pt, Pd, Au, Ni, Nd, Ir, Cr, or a compound thereof. For example, the first electrode 110 may have multi layers in which a compound containing 90% or more Ag is formed to a thickness of 500 Å to 2,000 Å, and ITO is formed to a thickness of 50 Å to 200 Å.

The organic layer is formed between the first electrode 110 and the second electrode 160, and includes an emitting material layer which emits red light, green light, and blue light.

Here, the organic layer may be formed of multi layers which are formed by stacking the hole transport layer, the emitting material layer, the charge generation layer, and the electron transport layer, and a total thickness of the organic layer may be 1,500 Å to 3,000 Å.

In the present invention, the organic layer may not be formed of a single layer but may be formed in a multi-layer structure where the emitting material layer, the charge generation layer, or the electron transport layer is stacked between the first electrode 110 and the second electrode 160 two or more times instead of one time. That is, the emitting material layer, the charge generation layer, or the electron transport layer may be formed as at least two or more.

The hole transport layer 120 easily transports a positive hole to the emission layer, and moreover prevents an electron, generated from the second electrode, from being moved to a portion other than an emission area, thereby increasing emission efficiency. That is, the hole transport layer 120 smoothly transports a positive hole, and may be formed of N,N-dinaphthyl-N,N'-diphenyl benzidine (NPD), N,N'-bis-(3-methylphenyl)-N,N'-bis-(phenyl)-benzidine (TPD), 4-(9H-carbazol-9-yl)-N,N-bis[4-(9H-carbazol-9-yl)phenyl]-benzenamine (TCTA), 4,4'-N,N'-dicarbazole-biphenyl (CBP), s-TAD, or 4,4',4"-Tris(N-3-methylphenyl-N-phenyl-amino)-triphenylamine (MTDATA). However, the spirit of the present invention is not limited thereto.

The emitting material layers 132R, 132G, 132B, 134R, 134G and 134B include a host and a dopant, and may be formed of a material which emits red light, green light, or blue light. The light emitting material may be a phosphor material or a fluorescent material. Also, a thickness of each of the emitting material layers 132R, 132G, 132B, 134R, 134G and 134B may be 50 Å to 3,000 Å.

Here, when the emitting material layers 132R and 134R emit red light, the emitting material layers 132R and 134R include a host material containing carbazole biphenyl (CBP) or 1,3-bis(carbazol-9-yl) (mCP). The the emitting material layers 132R and 134R may be a phosphor material containing a dopant containing one or more selected from PIQIr (acac)(bis(1-phenylisoquinoline)acetylacetonate iridium), PQIr(acac)(bis(1-phenylquinoline)acetylacetonate iridium), tris(1-phenylquinoline)iridium (PQIr), and octaethylporphyrin platinum (PtOEP), or may be a fluorescent material containing PBD:Eu(DBM)$_3$(Phen) or Perylene. However, the present invention is not limited thereto.

When the emitting material layers 132G and 134G emit green light, each of the emitting material layers 132G and 134G includes a host material containing CBP or mCP. The emitting material layers 132G and 134G may be a phosphor material containing a dopant material containing Ir(ppy)$_3$ (fac tris(2-phenylpyridine)iridium), or may be a fluorescent material containing Alq$_3$(tris(8-hydroxyquinolino)aluminum). However, the present invention is not limited thereto.

When the emitting material layers 132B, 134B emit green light, each of the emitting material layers 132B, 134B includes a host material containing CBP or mCP. The emitting material layers 132B, 134B may be a phosphor material containing a dopant material containing (4,6-F$_2$ppy)$_2$Irpic or L2BD111.

On the other hand, the host material may be a phosphor material containing one selected from spiro-DPVBi, spiro-6P, distyryl benzene (DSB), distyryl arylene (DSA), a PFO-based polymer, and a PPV-based polymer, but the present invention is not limited thereto.

The charge generation layers 152 and 154 may be formed of a double layer, and may be a P-N junction charge generation layer in which an N-type charge generation layer is joined to a P-type charge generation layer. The P-N junction charge generation layer generates an electric charge or separates a positive hole and an electron, and injects the electric charge into each of the emitting material layers. That is, the N-type charge generation layer 152 supplies an electron to the first to third emitting material layers 132R, 132G and 132B adjacent to the first electrode, and the P-type charge generation layer 154 supplies a positive hole to the fourth of sixth emitting material layers 134R, 134G and 134B adjacent to the second electrode 160. Accordingly, an emission efficiency of the organic light emitting display device including the plurality of emitting material layers can further increase, and moreover, a driving voltage can be lowered.

Here, the N-type charge generation layer 152 may be formed of an organic material with metal or an N-type dopant doped thereon. The metal may be one material selected from the group consisting of Li, Na, K, Rb, Cs, Mg, Ca, Sr, Ba, La, Ce, Sm, Eu, Tb, Dy, and Yb.

In this case, the N-type dopant and a host which are used for the organic material with the N-type dopant doped thereon may use a material which is generally used. For example, the N-type dopant may be alkali metal, an alkali metal compound, alkali earth metal, or an alkali earth metal compound. In more detail, the N-type dopant may be one selected from the group consisting of Cs, K, Rb, Mg, Na, Ca, Sr, Eu, and Yb. The host material may be one material selected from the group consisting of tris-8-hydroxyquinoline aluminum, triazine, hydroxyquinoline derivatives, benzazole derivatives, and silole derivatives.

Moreover, the P-type charge generation layer 154 may be formed of an organic material with metal or a P-type dopant doped thereon. The metal may be one material selected from the group consisting of Al, Cu, Fe, Pb, Zn, Au, Pt, W, In, Mo, Ni and Ti. Also, the P-type dopant and a host which are used for the organic material with the P-type dopant doped thereon may use a material which is generally used. For example, the P-type dopant may be one material selected from the group consisting of 2,3,5,6-tetra-fluoro-7,7,8,8-tetra Montepulciano Quay Nordica methane (F$_4$-TCNQ), 7,7,8,8-tetracyanoquinodimethane (TCNQ) derivatives, iodine, FeCl$_3$, FeF$_3$, and SbCl$_5$. Also, the host may be one material selected from the group consisting of N,N'-Di(Naphthalene-1-yl)-N,N'-Diphenyl-Benzidine (NPB), N,N'-

Diphenyl-N,N'-bis(3-methylphenyl)-(1,1'-biphenyl)-4,4'-diamine (TPD), and N,N,N',N'-tetra-naphthalenyl-benzidine (TNB).

The electron transport layers 142 and 144 allow an electron to be smoothly transported and injected, and an electron injection layer may be separately formed on the electron transport layers 142 and 144. The electron transport layers 142 and 144 may include one or more selected from tris(8-hydroxyquinolino)aluminum ($Alq_3$), PBD, TAZ, spiro-PBD, BAlq, and SAlq, but the spirit of the present invention is not limited thereto.

In the present specification, the organic layer has been described above as including the hole transport layer, the emitting material layer, the charge generation layer, and the electron transport layer, but one of the hole transport layer, the emitting material layer, the charge generation layer, and the electron transport layer may be omitted.

The second electrode 160 may be formed all over the substrate and on the organic layer. Here, the second electrode 160 may be formed in a double-layer structure, and thus, one double-layer structure selected from single/single, single/mixing, mixing/single, and mixing/mixing may be formed of a metal material or an inorganic material. The metal material may include Ag, Mg, Yb, Li, and Ca, or the inorganic material may include $Li_2O$, CaO, LiF, and $MgF_2$. A layer, in which metal and an inorganic material are mixed or metal and metal are mixed, may be formed at a ratio of 1:1 to 1:10 in metal:inorganic material or metal:metal.

Finally, the capping layer 170 increases a light extraction effect, and may be formed of one or more selected from a material forming the hole transport layer, a material forming the electron transport layer, and the host materials of the emitting material layers. However, the spirit of the present invention is not limited thereto.

Therefore, in the organic light emitting display device according to an embodiment of the present invention, when a certain voltage is applied to the first electrode 110 and the second electrode 160 according to a selected color signal, a positive hole and an electron are transported to the organic layer to generate an exciton. The exciton is shifted from an excited state to a ground state to generate light, and the light is emitted as visible light. At this time, the emitted light is output to the outside through the second electrode 160, thereby realizing an arbitrary image.

An encapsulation process should be performed for protecting an organic light emitting diode of each sub-pixel from the outside. In the present invention, a general thin film encapsulation method may be used. The thin film encapsulation method is technology which is well known to those skilled in the art, and thus, its detail description is not provided.

Hereinafter, a characteristic of the organic light emitting display device according to an embodiment of the present invention will be evaluated.

Figure 3:
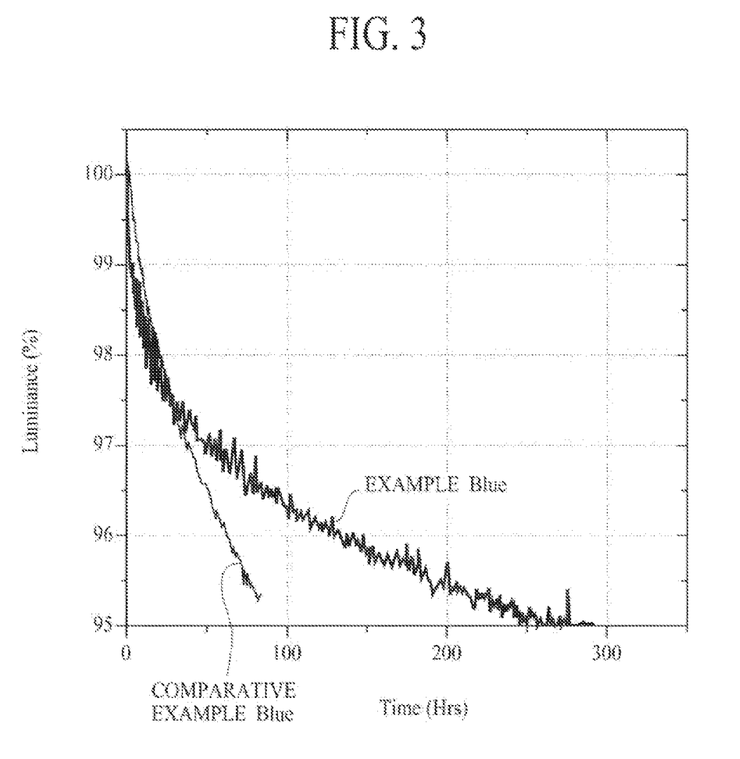
FIGS. 3 to 5 are diagrams showing life characteristic efficiency based on a luminance of an organic light emitting display device manufactured according to a comparative example according to the general art and an example of the present invention.
Figure 4:
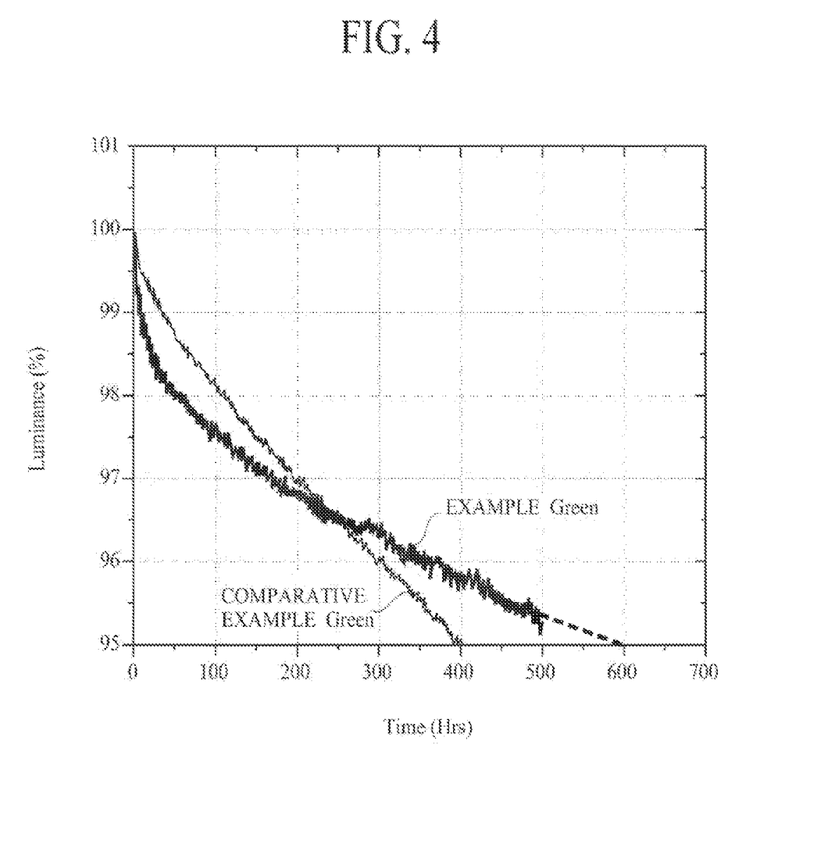
Figure 5:
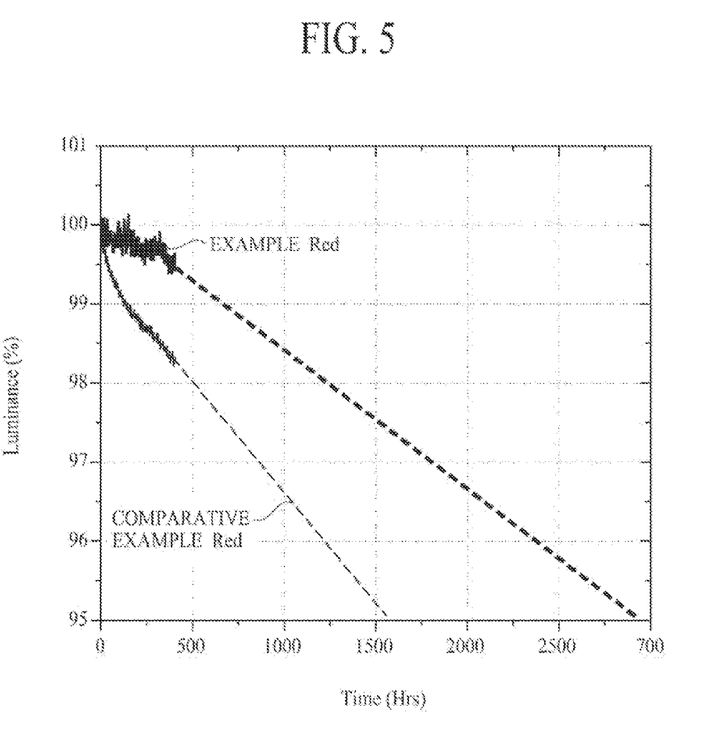

First, the following Tables 1 to 3 are comparative examples according to the general art, and show optical simulation results of the general organic light emitting display device of FIG. 1 ("Comparative Example") and the organic light emitting display device of FIG. 2 ("Example of Invention"). Also, FIGS. 3 to 5 are diagrams showing life characteristic efficiency based on a luminance of an organic light emitting display device manufactured according to a comparative example according to the general art and an example of the present invention.

In this case, an organic light emitting display device according to the comparative example and an organic light emitting display device according to the example are manufactured and experimented as follows.

Comparative Example According to General Art

A first electrode (ITO 70 Å/APC 100 Å/ITO 70 Å) is formed on a substrate. In this case, the first electrode has a red (R) pixel area, a green (G) pixel area, and a blue (B) pixel area. The pixel areas are divided by a bank layer (not shown). NPD (1100 Å) is formed all over the first electrode. In this case, a P-type doping material ($TCNQF_4$) is doped by 3% in an area (NPD 100 Å) adjacent to the first electrode in the NPD (1100 Å). Subsequently, TPD (200 Å) is formed in the green (G) pixel area, and NPD (900 Å) is formed in the red (R) pixel area. Then, TPD (100 Å) is formed on an entire surface. Pyren derivatives (a blue dopant (BD)) are doped by 5% on anthracene derivatives (200 Å), which are a blue host (BH), in the blue (B) pixel area. Two kinds of hosts (CBP and anthrancene derivatives) are mixed as a green host (GH) at a ratio of 1:1, and $ppy_2Ir$ (acac) which is used as a green dopant (GD) is doped by 5% on 400 Å in the green (G) pixel area. Also, 360 Å is formed in the red (R) pixel area by doping 5% $btp_2Ir(acac)$, which is used as a red dopant (RD), on Be complex derivatives (a red host (RH)). Subsequently, $Alq_3$ (350 Å) is formed on an entire surface at a ratio of Mg:LiF (1:1, 30 Å)/Ag:Mg (3:1, 160 Å), and then, a capping layer is formed of NPD on $Alq_3$ to have a thickness of 650 Å.

Example of the Present Invention

A first electrode (ITO 70 Å/APC 100 Å/ITO 70 Å) is formed on a substrate. In this case, the first electrode has a red (R) pixel area, a green (G) pixel area, and a blue (B) pixel area. The pixel areas are divided by a bank layer (not shown). NPD (375 Å) is formed all over the first electrode. In this case, a P-type doping material ($TCNQF_4$) is doped by 3% in an area (NPD 75 Å) adjacent to the first electrode. Subsequently, pyren derivatives (a BD) are doped by 5% on anthrancene derivatives (200 Å), which are a BH, in the blue (B) pixel area. Two kinds of hosts (CBP and anthrancene derivatives) are mixed as a GH at a ratio of 1:1, and $ppy_2Ir$ (acac) which is used as 370 ÅGD is doped by 5% in the green (G) pixel area. Also, 680 Å is formed in the red (R) pixel area by doping 5% $btp_2Ir(acac)$, which is used as an RD, on Be complex derivatives (an RH). Subsequently, $Alq_3$ 250 Å is formed on an entire surface, and then, Li is doped by 2% on a material (100 Å) forming an electron transport layer (ETL) of anthrancene derivatives. Subsequently, NPD (375 Å) is formed on an entire surface. In this case, a P-type doping material ($TCNQF_4$) is doped by 12% in an area (NPD 75 Å) adjacent to the electron transport layer, and pyren derivatives (a BD) are again doped by 5% on anthrancene derivatives (200 Å), which are a BH, in the blue (B) pixel area. Subsequently, two kinds of hosts (CBP and anthrancene derivatives) are mixed as a GH at a ratio of 1:1, and ppy2Ir (acac) which is used as 370 ÅGD is doped by 5% in the green (G) pixel area. Also, 680 Å is formed in the red (R) pixel area by doping 5% $btp_2Ir(acac)$, which is used as an RD, on Be complex derivatives (an RH). Subsequently, 350 Å is formed by mixing $Alq_3$ and LiQ at a ratio of 1:1, 30 Å is formed by mixing Mg and LiF at a ratio of 1:1, and 160 Å is formed by Ag and Mg at a ratio of 3:1. NPD (650 Å) is formed as a capping layer.

TABLE 1

Blue (B) Pixel Area

| | Voltage (V) | Current Efficiency (cd/A) | Power Efficiency (lm/W) | Color Coordinates (CIE_x) | Color Coordinates (CIE_y) | External Quantum Efficiency (EQE, %) |
|---|---|---|---|---|---|---|
| Comparative Example | 4.0 | 4.9 | 3.8 | 0.144 | 0.041 | 12.3 |
| Example of Invention | 7.2 | 7.8 | 3.3 | 0.143 | 0.046 | 17.8 |

TABLE 2

Green (G) Pixel Area

| | Voltage (V) | Current Efficiency (cd/A) | Power Efficiency (lm/W) | Color Coordinates (CIE_x) | Color Coordinates (CIE_y) | External Quantum Efficiency (EQE, %) |
|---|---|---|---|---|---|---|
| Comparative Example | 3.9 | 114.2 | 91.8 | 0.205 | 0.732 | 31.9 |
| Example of Invention | 7 | 169.9 | 77.9 | 0.203 | 0.725 | 49.3 |

TABLE 3

Red (R) Pixel Area

| | Voltage (V) | Current Efficiency (cd/A) | Power Efficiency (lm/W) | Color Coordinates (CIE_x) | Color Coordinates (CIE_y) | External Quantum Efficiency (EQE, %) |
|---|---|---|---|---|---|---|
| Comparative Example | 3.8 | 58.8 | 44.2 | 0.663 | 0.334 | 38.9 |
| Example of Invention | 9 | 111.2 | 38.9 | 0.650 | 0.347 | 62.9 |

As shown in Tables 1 to 3 and FIGS. 3 to 5, in comparison with the comparative example, in a case of the example according to the present invention, it can be seen that efficiency increases by about 50% in the blue pixel area, and a service life increases by about 180%. Also, it can be seen that efficiency increases by about 50% in the green pixel area, and a service life increases by about 75% according to examples of the present invention. Also, it can be seen that efficiency increase by about 90% in the red pixel area, and a service life increases by about 150% according to examples of the present invention.

As described above, in comparison with a structure in which an emitting material layer is stacked once, a structure in which the emitting material layer is stacked twice can greatly improve an efficiency and life characteristic of an organic light emitting display device.

Figure 6:
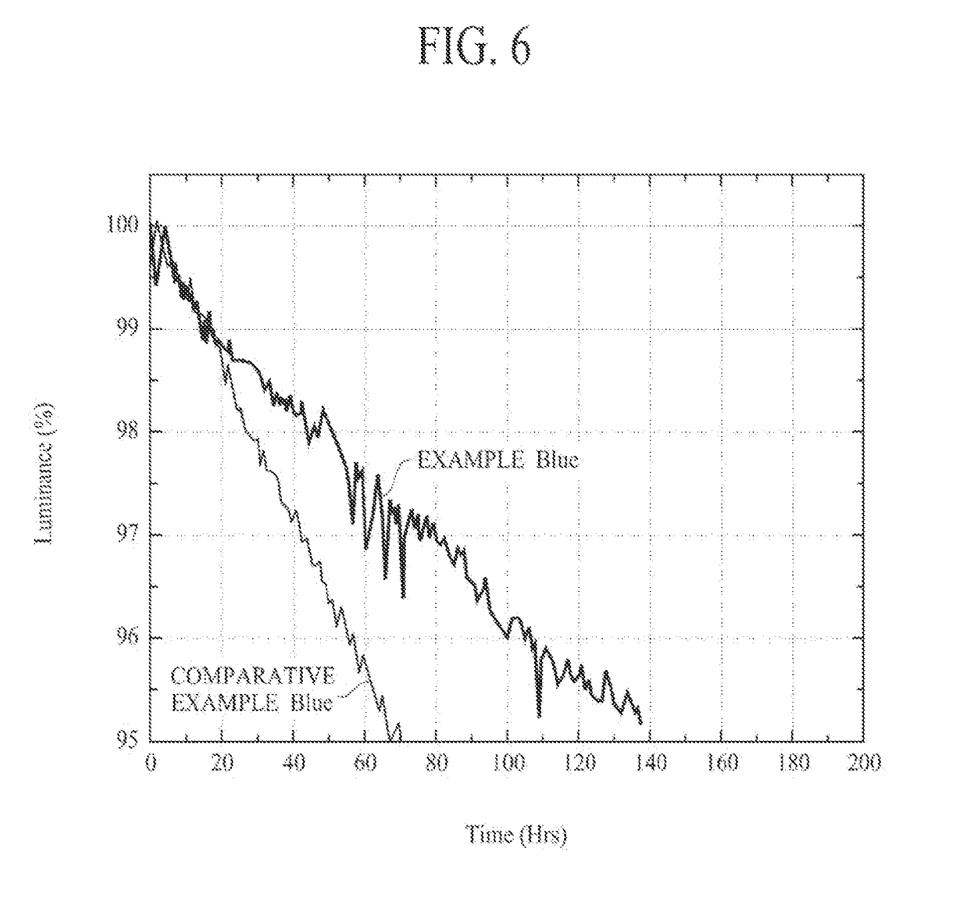
FIGS. 6 to 8 are diagrams showing a high temperature reliability evaluation of an organic light emitting display device manufactured according to a comparative example according to the general art and an example of the present invention.
Figure 7:
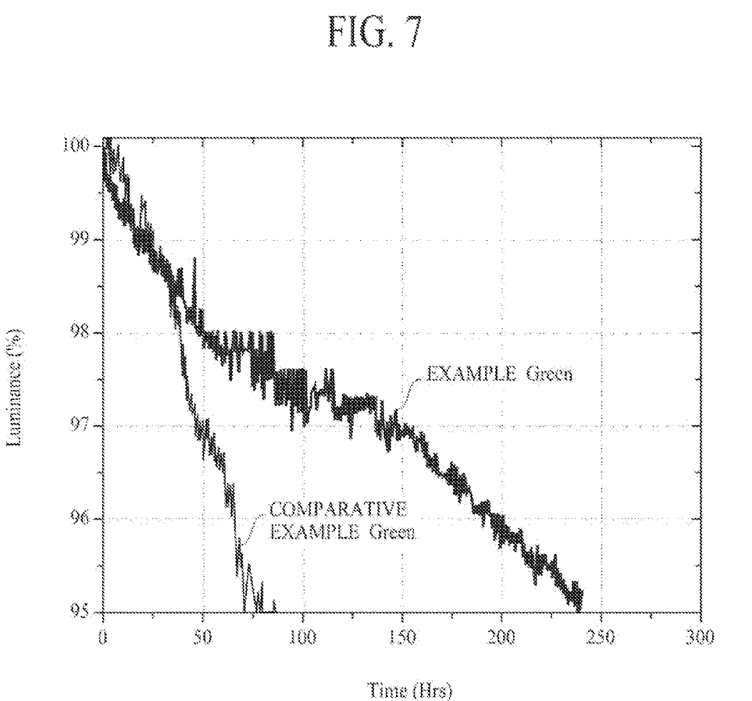
Figure 8:
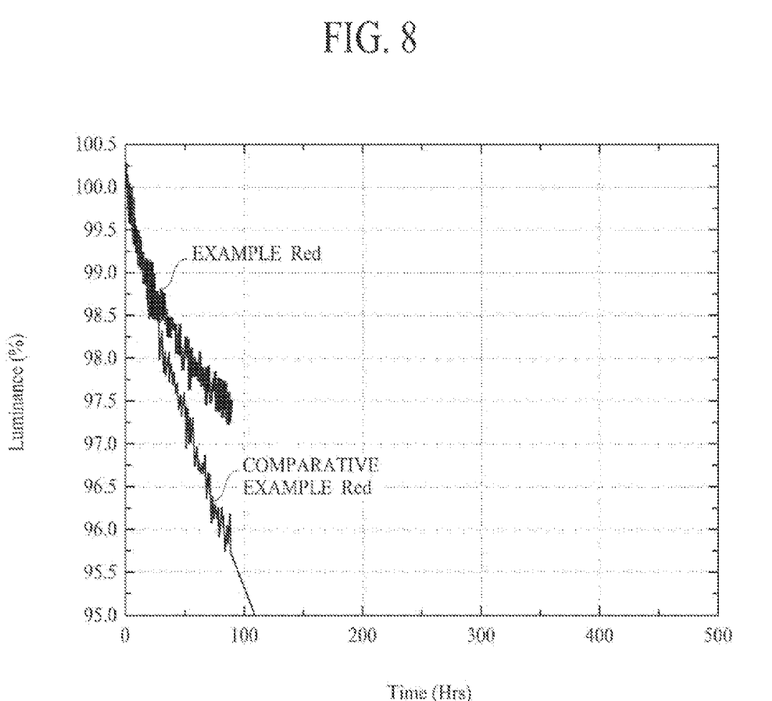

FIGS. 6 to 8 are diagrams showing a high temperature reliability evaluation of an organic light emitting display device manufactured according to a comparative example of the general art and an example of the present invention. Measurement is performed for 250 hours under a 3.2 inch full HD condition at a temperature of 70 degrees C., and high temperature operation reliability is evaluated under a full white condition. In this case, high temperature reliability evaluation is made by measuring a high temperature operation, and denotes that as a service life becomes longer, high temperature characteristic is good in high temperature driving. Also, since a service life is very long at a room temperature (25 degrees C.), the high temperature reliability evaluation is made by acceleration of a current. In FIG. 8, a current three times higher than an application current of FIG. 5 is applied.

As shown in FIGS. 6 to 8, in comparison with the organic light emitting display device according to the comparative example of the general art, in a case of the organic light emitting display device according to the example of the present invention, it is checked that a change amount (%) of luminance based on a time change is small.

As described above, in the organic light emitting display device according to an embodiment of the present invention, it can be seen that reliability characteristic is good under a high temperature.

Generally, due to an energy difference between the second electrode and the electron transport layer and an electron injection characteristic difference due to the energy difference, when driving is performed under a high temperature, a mobility of an electron increases, and for this reason, deterioration occurs in the emitting material layer or at an interface of the hole transport layer adjacent to the emitting material layer. A reduction rate of luminance is quickly lowered with a driving time under the room temperature (25 degrees C.).

However, in the organic light emitting display device according to an embodiment of the present invention, the emitting material layer is divided into two areas, and thus, an area in which deterioration occurs can be deconcentrated.

The number of moved electrons is reduced due to an application of a low current. That is, high temperature driving operation reliability is good due to a characteristic in which an electron is easily injected.

According to the embodiments of the present invention, provided can be an organic light emitting display device which has efficiency characteristic and a service life which are enhanced due to implementation of high luminance, and has good reliability under a high temperature. Accordingly, a high-resolution product for overcoming a structural limitation of general organic light emitting display devices can be implemented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a substrate in which a red pixel area, a green pixel area, and a blue pixel area are defined, wherein each pixel area comprises:
   a first electrode and a hole transport layer formed on the substrate;
   a first emitting material layer formed on the hole transport layer, the first emitting material layer disposed in the red, green, and blue pixel areas respectively having a different thickness;
   a first electron transport layer formed on the first emitting material layer;
   a first charge generation layer formed on the first electron transport layer;
   a second charge generation layer formed on the first charge generation layer;
   a second emitting material layer formed on the second charge generation layer, the second emitting material layer disposed in the red, green, and blue pixel areas respectively having a different thickness;
   a second electron transport layer formed on the second emitting material layer; and
   a second electrode formed on the second electron transport layer.

2. The organic light emitting display device of claim 1, wherein the first charge generation layer comprises a same material as the first electron transport layer and an N-type dopant.

3. The organic light emitting display device of claim 1, wherein the second charge generation layer comprises a same material as the hole transport layer and a P-type dopant.

4. The organic light emitting display device of claim 1, wherein the first and second emitting material layers of the red pixel area are formed of a red organic material.

5. The organic light emitting display device of claim 1, wherein the first and second emitting material layers of the green pixel area are formed of a green organic material.

6. The organic light emitting display device of claim 1, wherein the first and second emitting material layers of the blue pixel area are formed of a blue organic material.

7. The organic light emitting display device of claim 1, further comprising a hole injection layer formed between the hole transport layer and the first electrode.

8. The organic light emitting display device of claim 1, further comprising a capping layer formed on the second electrode.

9. A method of an organic light emitting display device, the method comprising:
   forming a first electrode all over a substrate in which a red pixel area, a green pixel area, and a blue pixel area are defined;
   forming a hole transport layer on the first electrode;
   forming first to third emitting material layers at respective positions corresponding to the red pixel area, the green pixel area, and the blue pixel area on the hole transport layer, wherein the first to third emitting material layers have different thicknesses;
   forming a first electron transport layer all over the first to third emitting material layers;
   forming a first charge generation layer and a second charge generation layer all over the first electron transport layer;
   forming fourth to sixth emitting material layers at respective positions corresponding to the red pixel area, the green pixel area, and the blue pixel area on the second charge generation layer, wherein the fourth to sixth emitting material layers have different thicknesses;
   forming a second electron transport layer all over the fourth to sixth emitting material layers; and
   forming a second electrode all over the second electron transport layer.

10. The method of claim 9, wherein the first charge generation layer is formed by doping an N-type dopant on a material forming the first electron transport layer.

11. The method of claim 9, wherein the second charge generation layer is formed by doping a P-type dopant on a material forming the hole transport layer.

12. The method of claim 9, wherein the first and fourth emitting material layers are formed of a red organic material.

13. The method of claim 9, wherein the second and fifth emitting material layers are formed of a green organic material.

14. The method of claim 9, wherein the third and sixth emitting material layers are formed of a blue organic material.

15. The method of claim 9, further comprising, before the forming of the hole transport layer, forming a hole injection layer on the first electrode.

16. The organic light emitting display device of claim 1, wherein the first electrode is an anode electrode formed of a reflective conductive material.

17. The organic light emitting display device of claim 1, wherein the substrate is formed of plastic or polymer film which is flexible.

18. The organic light emitting display device of claim 1, wherein the first charge generation layer is an N-type charge generation layer supplying an electron to the first emitting material layer adjacent to the first electrode.

19. The organic light emitting display device of claim 1, wherein the second charge generation layer is a P-type charge generation layer supplying a hole to the second emitting material layer adjacent to the second electrode.

20. The organic light emitting display device of claim 1, wherein the first emitting material layers disposed in the red, green, and blue pixel areas respectively are configured to emit light of different color, the second emitting material layers disposed in the red, green, and blue pixel areas respectively are configured to emit light of different color, and the first and second emitting material layers in each pixel area are configured to emit light of same color.

* * * * *